United States Patent
Gibson, Jr. et al.

(10) Patent No.: US 6,879,046 B2
(45) Date of Patent: Apr. 12, 2005

(54) SPLIT BARRIER LAYER INCLUDING NITROGEN-CONTAINING PORTION AND OXYGEN-CONTAINING PORTION

(75) Inventors: Gerald W Gibson, Jr., Orlando, FL (US); Scott Jessen, Orlando, FL (US); Steven Alan Lytle, Orlando, FL (US); Kurt George Steiner, Orlando, FL (US); Susan Clay Vitkavage, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/038,371

(22) Filed: Jan. 2, 2002

(65) Prior Publication Data

US 2003/0003765 A1 Jan. 2, 2003

Related U.S. Application Data (60) Provisional application No. 60/301,295, filed on Jun. 28, 2001.

(51) Int. Cl.$^7$ .......................... H01L 23/48; H01L 23/52; H01L 59/40

(52) U.S. Cl. ..................... 257/760; 257/750; 257/751; 257/752; 257/758; 438/760; 174/258; 174/256; 428/428; 428/446; 428/447; 428/448

(58) Field of Search .................... 257/750–760, 257/762; 438/760; 174/258, 256; 428/428, 446, 447, 448, 209, 210, 901

(56) References Cited

U.S. PATENT DOCUMENTS

| | | | |
|---|---|---|---|
| 5,456,762 A | * 10/1995 | Kariya et al. | ................ 136/258 |
| 5,494,859 A | 2/1996 | Kapoor | |
| 6,037,664 A | 3/2000 | Zhao et al. | |
| 6,037,668 A | * 3/2000 | Cave et al. | ................ 257/784 |
| 6,071,809 A | * 6/2000 | Zhao | ............................ 438/634 |
| 6,083,822 A | * 7/2000 | Lee | ............................... 438/624 |
| 6,140,226 A | * 10/2000 | Grill et al. | ................... 438/637 |
| 6,165,891 A | * 12/2000 | Chooi et al. | ................. 438/622 |
| 6,191,028 B1 | 2/2001 | Huang et al. | |
| 6,265,321 B1 | * 7/2001 | Chooi et al. | ................. 438/725 |

(Continued)

FOREIGN PATENT DOCUMENTS

| | | | | |
|---|---|---|---|---|
| GB | 2341484 A | 9/1998 | ......... | H01L/21/285 |
| GB | 2365215 A | 2/2002 | ........... | H01L/21/02 |
| GB | 2367426 A | 4/2002 | ......... | H01L/23/532 |
| JP | 2001085523 A | * 3/2001 | | |

OTHER PUBLICATIONS

U.S. Appl. No. 10/038,352, filed Jan. 2, 2002.

*Primary Examiner*—George Eckert
*Assistant Examiner*—Chris C. Chu (57) ABSTRACT

A split barrier layer enables copper interconnect wires to be used in conjunction with low-k dielectric films by preventing the diffusion of N—H base groups into photoresists where they can render the photoresist insoluble. The split barrier layer is disposed between the copper and the low-k dielectric and includes a nitrogen-containing, oxygen-free film which contacts the copper, and an oxygen-containing, nitrogen-free film which contacts the low-k dielectric film. The nitrogen-containing film prevents the formation of undesirable copper oxides, and the oxygen-containing film prevents the diffusion of N—H base groups into the low-k dielectric films. The oxygen-containing film may be an oxygen-doped silicon carbide film in an exemplary embodiment. In another embodiment, a film stack of low-k dielectric films includes an etch-stop layer and hardmask each formed of oxygen-doped silicon carbide. The hardmask and etch-stop layer enable the formation of a dual-damascene opening in the film stack, and the film structure of the present invention precludes N—H base groups from diffusing from the low-k dielectric films and neutralizing acid catalysts in the photoresist used to define the dual damascene opening.

13 Claims, 4 Drawing Sheets

U.S. PATENT DOCUMENTS 6,297,162 B1 * 10/2001 Jang et al. .................. 438/706
6,323,121 B1    11/2001 Liu et al.
6,340,435 B1 *  1/2002 Bjorkman et al. ............ 216/72
6,420,261 B2    7/2002 Kudo
6,624,053 B2 *  9/2003 Passemard .................. 438/584
6,632,478 B2 * 10/2003 Gaillard et al. ........ 427/255.37

* cited by examiner

SPLIT BARRIER LAYER INCLUDING NITROGEN-CONTAINING PORTION AND OXYGEN-CONTAINING PORTION

RELATED APPLICATION

This application claims priority of U.S. provisional application Ser. No. 60/301,295, entitled Full Via First Integration Method of Manufacture, and filed on Jun. 28, 2001, the contents of which are herein incorporated by reference.

FIELD OF THE INVENTION

The present invention relates most generally to semiconductor devices and methods for manufacturing the same. More particularly, the present invention provides a method and structure for preventing base groups from becoming nested in a low-k dielectric material and subsequently rendering photoresists insoluble.

BACKGROUND OF THE INVENTION

Deep ultra-violet (DUV) lithography is widely used in the fabrication of advanced VLSI (Very Large Scale Integration) semiconductor devices. Chemically amplified DUV photoresists improve the performance of the lithography systems and improve device feature resolution. Low dielectric constant (low-k) dielectrics are favored in today's semiconductor manufacturing industry because of the performance improvements they provide by way of reducing parasitic capacitance, reducing propagation delay and therefore increasing device speed. The use of copper interconnect features is also favored to reduce line resistance of the interconnect lines. Typical copper interconnect schemes incorporate damascene manufacturing techniques to define the interconnect paths. A dual damascene approach is favored because it provides lower cost processing, improved level-to-level alignment tolerance and thus allows for tighter design rules and improved performance.

A shortcoming associated with the use of low-k dielectrics in conjunction with copper interconnect lines and chemically amplified photoresists used in DUV lithography, is that base groups which become nested in porous low-k dielectric materials, can interact with the acid catalysts included in chemically amplified photoresists to render the exposed photoresist insoluble in developer. This insoluble photoresist distorts the pattern being formed and is difficult to remove. The distorted pattern may result in electrical opens because via and contact openings cannot be formed. Base groups such as amines and other N—H base groups, are typically produced in association with conventional hardmask films, etch-stop layers and barrier films used in the film stack that also includes low-k dielectric films, and which is advantageously used in dual damascene processing. Etch-stop films and barrier films are commonly nitrogen-containing films, and amine or other N—H base groups may be produced during the formation of such films.

The use of copper as an interconnect material requires the use of a barrier layer which typically includes nitrogen and is free of oxygen. The presence of oxygen in an adjoining film or during the formation of an adjacent film, undesirably causes the formation of copper oxides by reaction with copper. Copper oxides undesirably degrade adhesion which could lead to mechanical failure. Moreover, after copper interconnect lines are formed using damascene technology, for example, organic corrosion inhibitors are typically formed over the copper surface. The organic corrosion inhibitors prevent the formation of copper oxides and prevent corrosion from occurring while the substrate including the exposed copper film, is transferred from a polishing tool, for example, to a film deposition tool used to form films over the copper surface. A plasma chemistry including ammonia, $NH_3$, is typically used to clean or treat the copper surface, remove any copper oxides which may form, and to remove the organic corrosion inhibitor. This ammonia-containing chemistry also produces amines or other N—H base groups which can diffuse into the porous low-k dielectric material and then into the photoresists.

It is therefore desirable to enjoy the benefits provided by copper interconnect lines, low-k dielectric films and chemically amplified photoresists in DUV lithography systems, without degrading the chemically amplified photoresist by interaction with base groups from the porous low-k dielectric film.

SUMMARY OF THE INVENTION

The present invention provides a method and structure for isolating a copper surface and a nitrogen-containing barrier layer film, from a low-k dielectric material. An oxygen-containing, substantially nitrogen-free film is formed between the nitrogen-containing barrier layer film and the low-k dielectric material. The nitrogen-containing, substantially oxygen-free film and oxygen-containing, substantially nitrogen-free film combine to form a composite barrier layer. In another exemplary embodiment, the composite barrier layer is used to isolate a conductive material which is readily oxidizable and subject to corrosion, from a low-k dielectric material.

According to another exemplary embodiment, the present invention provides a film stack including low-k dielectric films, a hardmask film formed over the low-k dielectric films, and an etch-stop layer formed between low-k dielectric films. Each of the hardmask film and the etch-stop layer are formed of oxygen-doped silicon carbide, SiC—O. A dual-damascene opening may be formed in the film stack to include a wider upper portion that extends through the hardmask and upper low-k dielectric layer, and a narrower lower portion extending through the lower low-k dielectric layer.

According to another exemplary embodiment, the film stack may be formed over an oxygen-doped, substantially nitrogen-free barrier layer formed over a nitrogen containing barrier layer formed, in turn, over a copper-containing surface.

According to another exemplary embodiment, the present invention provides a process for forming a semiconductor product. The process includes treating a surface with an ammonia-containing chemistry, forming a first barrier layer over the surface and a second barrier layer over the first barrier layer, and forming a low-k dielectric film over the second barrier layer. The first barrier layer includes nitrogen and is substantially free of oxygen, and the second barrier layer includes oxygen and is substantially free of nitrogen.

According to another exemplary embodiment, the present invention provides a further process for forming a semiconductor product. The process includes providing a copper surface, forming a first barrier layer over the copper surface, forming a second barrier layer of oxygen-doped silicon carbide over the first barrier layer, and forming a porous low-k dielectric film over the second barrier layer. The first barrier layer includes nitrogen and is substantially free of oxygen.

BRIEF DESCRIPTION OF THE DRAWING

The invention is best understood from the following detailed description when read in conjunction with the accompanying drawing. It is emphasized that, according to common practice, the various features of the drawing are not to scale. On the contrary, the dimensions of the various features are arbitrarily expanded or reduced for clarity. Like numerals denote like features throughout the specification and drawing. Included in the drawing are the following figures.

DETAILED DESCRIPTION OF THE INVENTION

The present invention provides a split barrier layer including a layer of a nitrogen-containing material such as nitrogen-doped silicon carbide or silicon nitride, and a layer of an oxygen-containing film. The split barrier layer is advantageously formed between a conductive film, and a low-k dielectric material. The conductive film may be readily oxidizable and susceptible to corrosion. In one exemplary embodiment, the split barrier layer is formed between a copper-containing surface and a low-k dielectric film. The layer which includes nitrogen is substantially free of oxygen and forms a boundary with the conductive film such as copper and prevents copper oxidation in an exemplary embodiment. The oxygen-containing film is substantially free of nitrogen and is preferably formed of oxygen-doped silicon carbide in an exemplary embodiment. It forms a boundary with the low-k dielectric material and prevents amines and other N—H base groups such as amino-silanes, from diffusing into the low-k dielectric material. The amine or other N—H base groups may be contained within the nitrogen-containing portion of the split barrier layer. The amine or other N—H base materials may additionally or alternatively be produced during the formation process which is used to form the nitrogen-containing barrier layer film. Typical deposition chemistries used to form the nitrogen-containing film include or produce ammonia, $NH_3$, which readily diffuses into and throughout low-k dielectric material. Ammonia, various amines and other N—H base groups may be used in the film formation chemistry and/or may be by-products and may diffuse into and throughout the porous low-k dielectric film if not suppressed by the presence of the oxygen-containing film of the split barrier layer.

A film stack of an exemplary embodiment of the present invention includes a low-k dielectric film or films formed over the split barrier layer, and the film stack may further include at least one etch-stop layer and hardmask film, each preferably formed of oxygen-doped silicon carbide, SiC—O. These SiC—O films are formed using a process that preferably does not utilize or generate chemistries which include N—H base groups. Other oxygen-containing films which are substantially free of nitrogen and do not generate amines or other N—H base groups during their formation may be used in other exemplary embodiments. An advantage of the present invention is the hardmask film, etch-stop layer, and oxygen-containing portion of the split barrier layer film which preclude amine or other N—H base groups from diffusing into the low-k dielectric materials and then diffusing into the photoresist, rendering the photoresist insoluble. According to the embodiment in which cooper is used as the conductive interconnect material, the present invention also retains the advantageous aspect of performing an ammonia plasma copper oxide reduction operation and organic clean on the copper surface, without having ammonia or other basic by-products of the ammonia plasma chemistry becoming nested within the low-k dielectric films.

Figure 1:
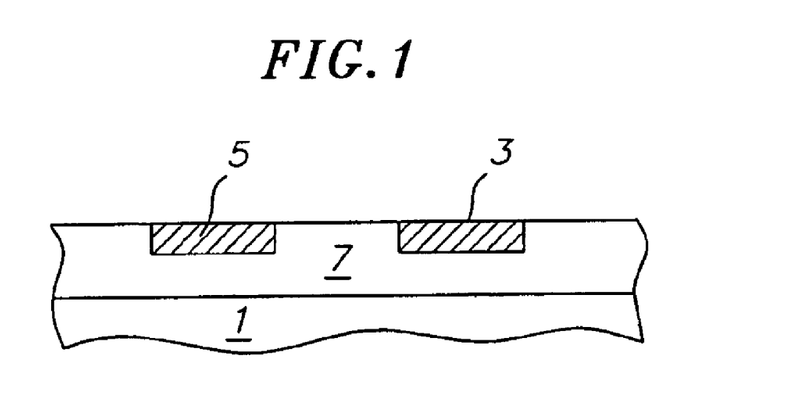
FIG. 1 is a cross-sectional view showing exemplary copper interconnect wires formed using damascene techniques.

FIG. 1 is a cross-sectional view showing an exemplary sub-structure of the present invention. Conductive lines 5 are formed with an insulating material 7. Conductive lines 5 may be formed of copper in the exemplary embodiment, but other suitable conductive materials may be used according to other exemplary embodiments. Insulating material 7 may be a low-k dielectric or other dielectric or insulating material. In the exemplary embodiment, conductive lines 5 and insulating material 7 include a common, planar upper surface including upper surface 3 of conductive line 5. The structure may be formed using damascene techniques and using chemical mechanical polishing.

Low-k dielectric films are characterized by a dielectric constant being less than the dielectric constant of silicon dioxide, which is typically about 3.9–4.1. In an exemplary embodiment, the low-k dielectric may have a dielectric constant that is less than 3.5. Low-k dielectric materials are favored because dielectric constant is directly proportional to capacitance and propagation delay, and therefore inversely proportional to circuit speed. Methods for reducing the dielectric constant of a silicon dioxide film include doping with fluorine, doping with carbon, and incorporating porosity, since vacuum has a dielectric constant of about 1.0. As such, a porous low-k dielectric material is favored. In an exemplary embodiment, the low-k dielectric film may be an organo-silicate-glass (OSG). According to another exemplary embodiment, the low-k dielectric material may be a porous low-k dielectric such as SiOC—H, such as deposited from tetra-methyl-cyclo-tetra-siloxane, oxygen, and carbon dioxide using a PECVD process. According to another exemplary embodiment, the low-k dielectric may be a spin-on aromatic carbon with porogen, that is subsequently baked to create pores. According to other exemplary embodiments, commercially-available OSG materials such as Black Diamond (Applied Materials Corporation), Coral (Novellus), FlowFill (Trikon), and Eagel2 (ASM) may be used. Such low-k dielectric materials are intended to be exemplary only, and other low-k dielectric materials may be used according to other exemplary embodiments. The low-k dielectric material may be formed using PECVD (plasma-enhanced chemical vapor deposition) or spin-on techniques, but other methods of formation may be used in other exemplary embodiments.

Returning to FIG. 1, after the exemplary structure shown in FIG. 1 has been formed, such as by chemical mechanical polishing, and includes copper as conductive wires 5 in the exemplary embodiment, upper surface 3 may be coated with an organic corrosion inhibitor to inhibit corrosion which may otherwise result when substrate 1 is removed from the polishing or CMP (chemical mechanical polishing) system. According to other exemplary embodiments, other conductive material such as metals which may be readily oxidizable and/or susceptible to corrosion, may be used and coated with a corrosion inhibitor. The coated, upper surface 3 is then treated using an ammonia plasma. The ammonia plasma is used to clean surface 3 and remove the organic corrosion inhibitor and any other organic residuals, as well as any oxides such as copper oxide, which may have formed. After upper surface 3 is so treated, the substructure shown in FIG. 1 is ready to have a film stack formed thereover.

The film stack that is to be formed over the substructure includes at least one low-k dielectric film and additional films such as etch-stop layers, barrier layers, and a hardmask which aid in the formation of a dual-damascene opening formed within the film structure. The dual-damascene opening may be used to provide contact to a subjacent conductive wire or wires, such as conductive wire 5.

Figure 2:
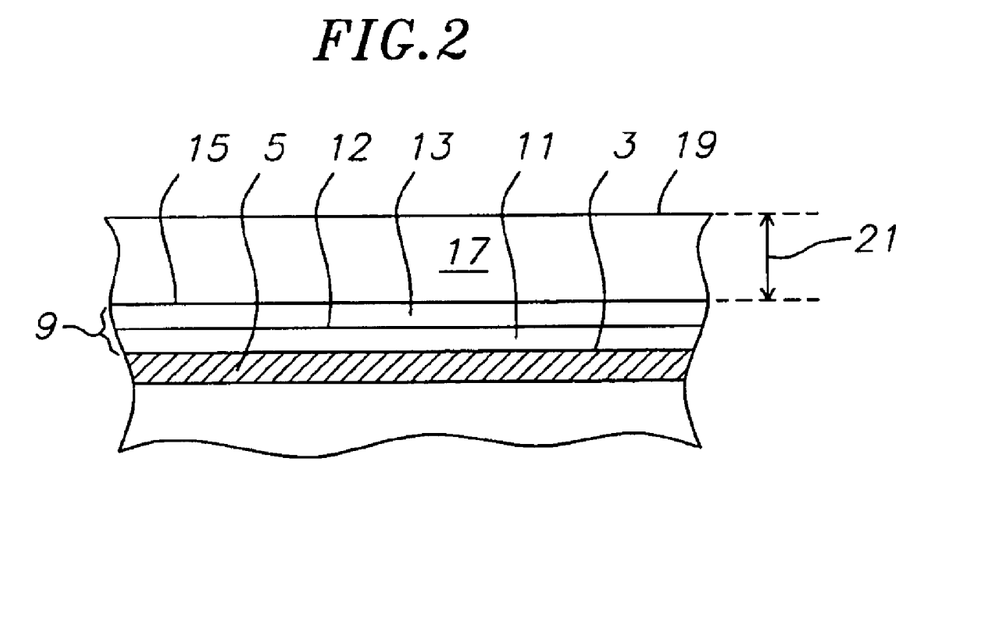
FIG. 2 is a cross-sectional view showing an exemplary composite barrier layer structure formed over a conductive material, and a low-k dielectric film formed over the composite barrier layer.

FIG. 2 shows exemplary composite barrier layer 9 and low-k dielectric film 17 formed over upper surface 3. In the exemplary embodiment shown in FIG. 2, upper surface 3 is the upper surface of a conductive wire 5 which may be copper in an exemplary embodiment. Other suitable conductive materials may be used alternatively. Lower barrier layer 11 includes top surface 12 and may be silicon nitride or nitrogen-doped silicon carbide, according to the exemplary embodiments. According to one exemplary embodiment, lower barrier layer 11 may be nitrogen-doped silicon carbide formed using a PECVD process which includes tetra-methyl-silane, silane, ammonia, and nitrogen in the plasma chemistry. According to another exemplary embodiment in which barrier layer 11 is a silicon nitride film, a PECVD process utilizing silane, ammonia and $N_2$ may be used. Other techniques for forming lower barrier layer film 11 may be used alternatively. A fundamental concept of the present invention is that lower barrier layer 11 is a nitrogen-containing film and is substantially free of oxygen. This suppresses the undesirable oxidation of the conductive material that forms conductive wire 5. Upper barrier layer film 13 includes top surface 15 and is advantageously formed of oxygen-doped silicon carbide, but silicon dioxide or other oxygen-containing films that are substantially free of nitrogen and which preferably do not generate amines or other N—H base groups in their formation processes, may be used in other exemplary embodiments. A PECVD process which includes tetra-methyl-silane and carbon dioxide in the plasma chemistry may be used to form oxygen-doped silicon carbide upper barrier layer film 13, in an exemplary embodiment. Generally speaking, upper barrier layer film 13 is an oxygen-containing, substantially nitrogen-free film.

Lower low-k dielectric film 17 includes top surface 19 and is as described above. Thickness 21 of lower low-k dielectric film 17 will vary according to application and may range from 1000 to 10000 angstroms in various exemplary embodiments. Other thicknesses may be used in other exemplary embodiments. In an exemplary embodiment, lower low-k dielectric film 17 may be a SiOC—H film deposited using a PECVD process and using tetra-methyl-cyclo-tetra-siloxane, oxygen, and carbon dioxide in the plasma chemistry.

Figure 3:
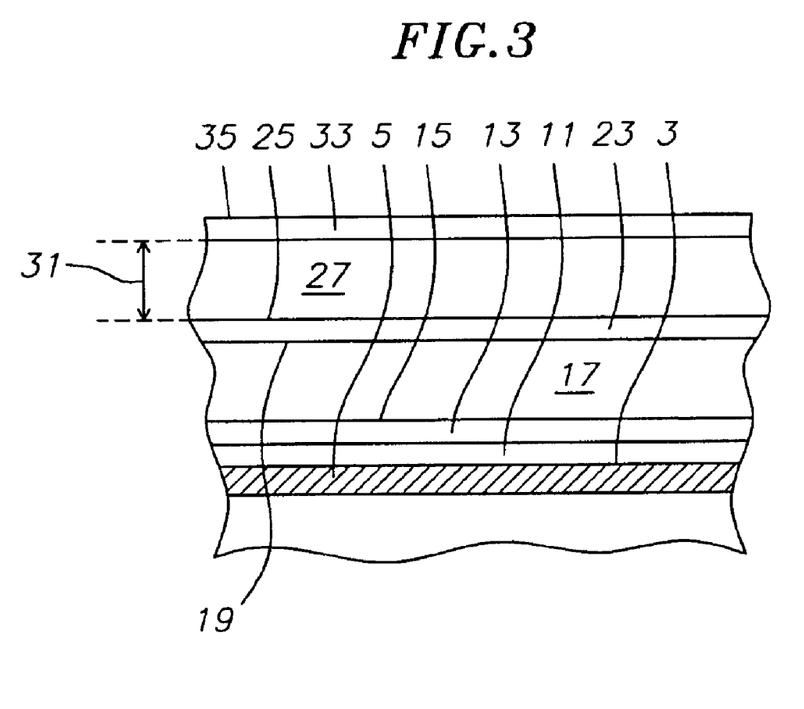
FIG. 3 is a cross-sectional view showing an exemplary etch-stop layer, upper low-k dielectric film and hardmask formed over the structure shown in FIG. 2.

Now turning to FIG. 3, etch-stop layer 23 is formed over top surface 19 of lower low-k dielectric film 17. Etch-stop layer 23 may be formed of oxygen-doped silicon carbide or other oxygen-containing, nitrogen-free films which preferably do not generate amines or other N—H base groups in their formation processes. Upper low-k dielectric film 27 is formed over top surface 25 of etch-stop film 23. Upper low-k dielectric film 27 includes thickness 31 which may range from 1000 to 10000 angstroms depending on application and other thicknesses may be used according to other exemplary embodiments. Hardmask film 33 is formed over upper low-k dielectric film 27. In an exemplary embodiment, hardmask film 33 may be formed of oxygen-doped silicon carbide, SiC—O, but other oxygen-containing, substantially nitrogen-free films which preferably do not generate amines or other N—H base groups in their formation processes, may be used alternatively. An advantage of the film stack structure shown in FIG. 3 is that any amines, amino-silanes and other N—H base groups which may be produced during the formation of lower barrier layer 11 and/or the treatment of upper surface 3, are prevented by upper barrier layer film 13 from diffusing into the low-k dielectric films. Additionally, since each of etch-stop layer 23 and hardmask film 33 are formed of SiC—O, or other oxygen-containing, nitrogen-free films, no amine or other N—H base groups are produced during the formation of films 23 and 33 to become nested in the low-k dielectric films.

Figure 4:
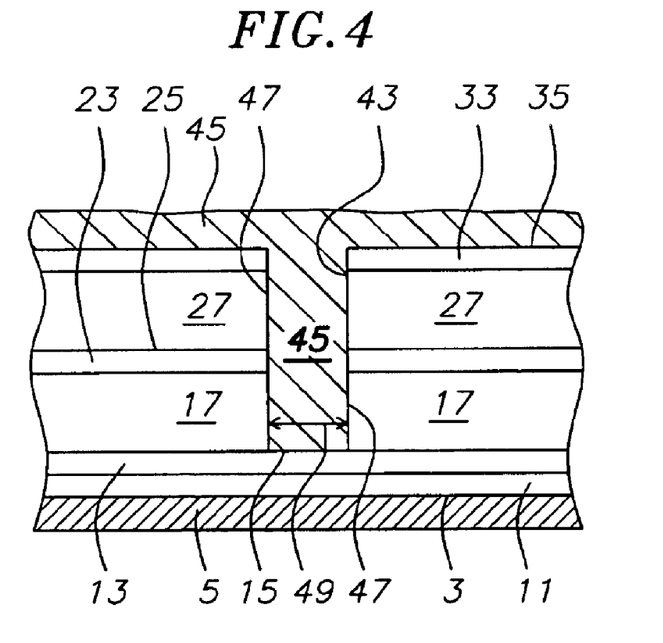
FIG. 4 is a cross-sectional view showing an opening formed in the structure shown in FIG. 3 and a photosensitive film formed over the structure and within the opening.

FIG. 4 shows opening 43 extending down from top surface 35 of hardmask film 33 and extending through hardmask film 33, upper low-k dielectric film 27, etch-stop layer 23 and lower low-k dielectric film 17. Opening 43 terminates on top surface 15 of upper barrier layer film 13. Opening 43 may take on various other configurations according to other exemplary embodiments. Opening 43 may extend to various widths and various different depths according to other exemplary embodiments. In other embodiments, opening 43 may not fully extend down to top surface 15 of upper barrier layer film 13. Opening 43 includes width 49, and sidewalls 47 are formed between low-k dielectric materials and opening 43. Various suitable means, such as plasma etching, may be used to form opening 43, after a masking pattern has been formed over the film stack.

Subsequent to the formation of opening 43, a dual-damascene opening will desirably be formed utilizing opening 43 as a portion of the dual-damascene, or two-tiered opening. As such, photosensitive film 45 is formed over the structure using conventional methods such as by coating. Photosensitive film 45 is formed over top surface 35 and fills opening 43. Photosensitive film 45 may be a commercially-available photoresist such as DUV (deep ultra-violet) photoresist. In an exemplary embodiment, photosensitive film 45 may be a chemically-amplified DUV photoresist that includes acid catalysts which render the photoresist material soluble in developer when exposed to ultraviolet light. Other photosensitive materials may be used alternatively. Upper barrier layer film 13 prevents photosensitive film 45 from contacting lower barrier layer film 11. After photosensitive film 45 is formed as shown in FIG. 4, a pattern may be formed within photosensitive film 45 to create the dual-damascene structure.

Figure 5:
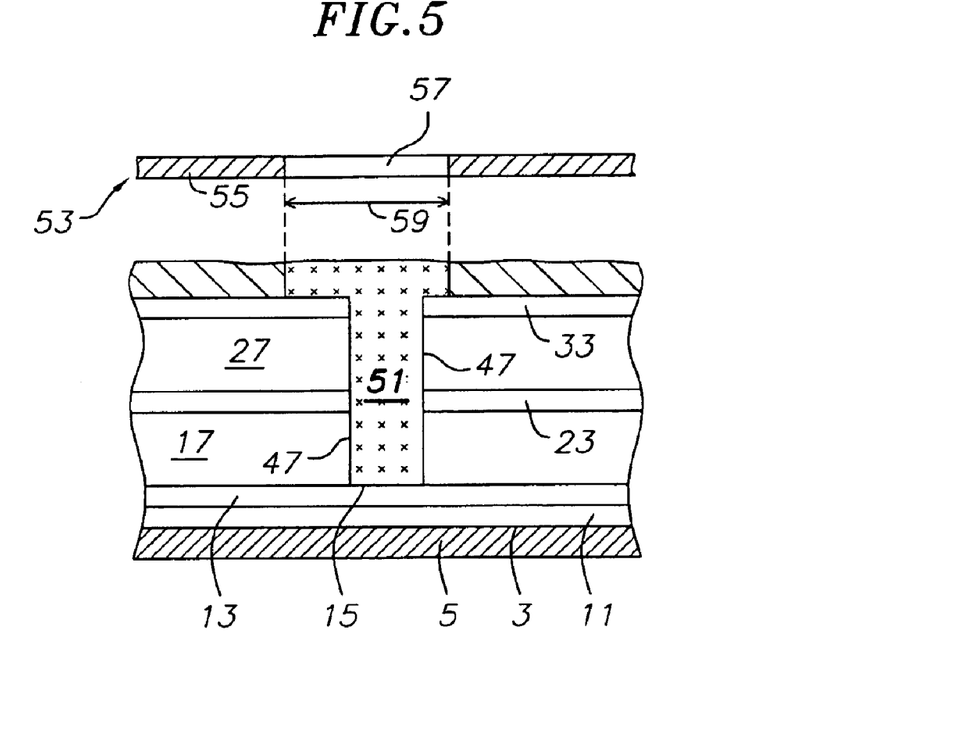
FIG. 5 shows the structure shown in FIG. 4 after portions of the photosensitive material have been exposed.

FIG. 5 shows the structure shown in FIG. 4 after an exemplary pattern has been formed using photomask 53. Photomask 53 includes transmissive section 57 and opaque sections 55, chosen to be transmissive and opaque, respectively, to the light used to expose photosensitive film 45. The light which is used for exposure is chosen in conjunction with photosensitive film 45. In an exemplary embodiment, ultraviolet light may be used in conjunction with a DUV photoresist. When portions of photosensitive film 45 are exposed by a DUV light source through the transmissive portions of the pattern formed in photomask 53, these selective, exposed portions of photosensitive film 45 become soluble in developer. When a developer subsequently contacts photosensitive film 45, the sections which have been exposed and are soluble in developer, are developed away, and a pattern is formed in photosensitive film 45. A substantially identical pattern can then be formed in the underlying structure, such as in the exemplary film stack, using etching or other techniques. FIG. 5 shows exposed section 51 of photosensitive film 45. Exposed section 51 includes width 59 and is soluble in developer. Due to upper barrier layer film 13, etch-stop layer 23, and hardmask film 33 of the present invention, low-k dielectric films 17 and 27 do not include base groups such as N—H base groups or other nitrogen-containing base groups such as amines or amino-silicates. If present, such base groups could pass through sidewalls 47, neutralize the acid catalysts within photosensitive film 45, and render insoluble portions of photosensitive film 45 which are desirably exposed and soluble in developer. Similarly, photosensitive film 45 is isolated from nitrogen-containing lower barrier layer film 11, by upper barrier layer film 13 which prevents diffusion of base groups, as above, from lower barrier layer film 11 and/or upper surface 3, into photosensitive film 45. According to the present invention, exposed section 51 of photosensitive film 45 extends down to the bottom of opening 43 (surface 15) and is substantially fully soluble in developer because the acid catalysts in photosensitive film 45 have not complexed with base groups and have not been neutralized and rendered ineffective. The acid catalysts in exposed section 51 of photosensitive film 45 therefore render exposed section 51 soluble in developer after being exposed by ultraviolet light. After exposed section 51 has been developed and removed, an etching process may be used to form the exemplary dual-damascene structure shown in FIG. 7.

Figure 6:
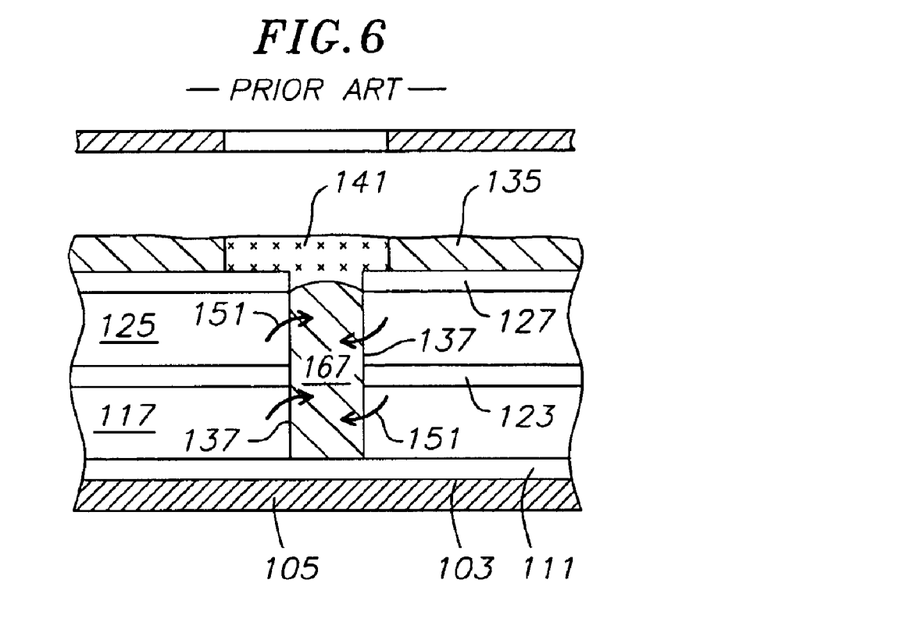
FIG. 6 is a cross-sectional view showing insoluble photoresist in a via opening according to the PRIOR ART.

In comparison, FIG. 6 is a cross-sectional view showing an exemplary structure as in the PRIOR ART. According to the prior art, a barrier layer structure capable of preventing the diffusion of N—H base groups is not used, and at least one of optional barrier layer film 111, etch-stop layer 123, and hardmask film 127 may be formed to include nitrogen. Ammonia and other nitrogen-containing species may be used to treat surface 103 of conductive interconnect material 105, and to form films 111, 123 and 127. As such, amines, amino-silicates, and other N—H base groups may be produced during these surface treatment and film production processes. In some cases, barrier layer 111 may not be used and N—H or other base groups present on surface 103 may diffuse directly into low-k dielectric film 117. These amines, amino-silicates, and other N—H base groups may additionally or alternatively be included within formed films 111, 123 and 127. These N—H base groups become nested in low-k dielectric films 117 and 125, by diffusion. From the low-k dielectric films, the N—H or other base groups diffuse through sidewall 137 and into photosensitive film 135 as indicated by arrows 151. Photosensitive film 135 includes exposed section 141, but also includes neutralized section 167 in which N—H or other base groups have complexed with the acid catalysts to neutralize the acid catalysts and thereby render neutralized portion 167 insoluble. If the structure shown in the prior art illustration of FIG. 6 is exposed to developer, only exposed section 141 will be developed away, and neutralized portion 167 will remain and prevent effective etching of the desired dual damascene structure. If the desired dual damascene structure is not properly formed and/or if the neutralized portion 167 of photoresist is not removed, opens may result between subjacent conductive interconnect material 105 and a conductive interconnect material desired to be introduced into the dual damascene structure.

Figure 7:
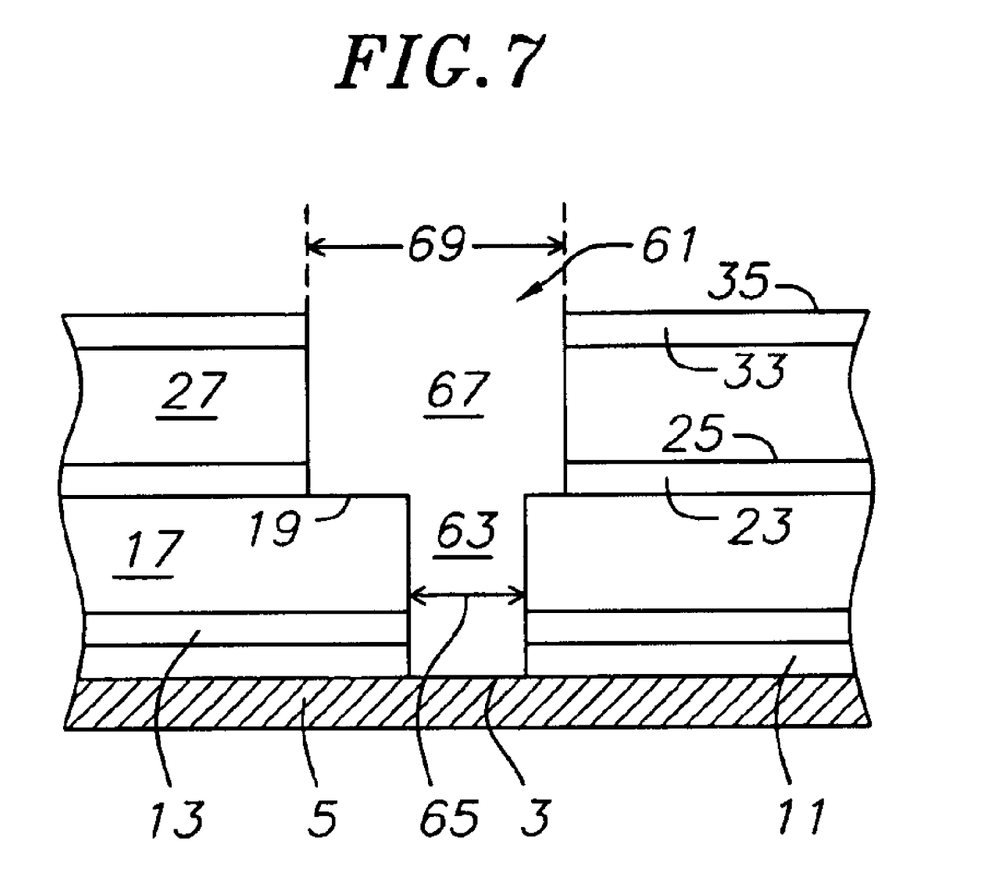
FIG. 7 is a cross-sectional view showing a dual-damascene opening formed in the structure shown in FIG. 5.

FIG. 7 shows an exemplary dual-damascene or two-tiered opening formed after the structure of the present invention shown in FIG. 5, has been exposed to developer, thereby forming a masking pattern in photosensitive film 45 (FIG. 5), and subsequently etched. Conventional etching techniques such as plasma etching may be used to form dual-damascene opening 61. According to one exemplary embodiment, a sequence of etch operations may be used to achieve the final, dual-damascene opening and may include an intermediate etching step which terminates at etch-stop layer 23 and a subsequent etching process step to remove exposed portions of lower barrier layer film 11 and etch-stop layer 23. Other etch process sequences may be used in other exemplary embodiments.

Dual-damascene opening 61 extends down from top surface 35 of hardmask film 33 and through hardmask film 33, upper low-k dielectric film 27, etch-stop film 23, lower low-k dielectric film 17, upper barrier layer 13 and lower barrier layer film 11 and terminates on upper surface 3 of conductive line 5. Dual-damascene opening 61 includes wider upper portion 67 and narrower lower portion 63. Width 69 of wider upper portion 67 is greater than width 65 of narrower lower portion 63, which is substantially the same as width 49 of original opening 43, such as shown in FIG. 4. Width 69 may be essentially the same as Width 59 (FIG. 5) or it may vary depending on the etch bias of the etch process. Upper portion 67 extends through hardmask film 33, upper low-k dielectric film 27 and etch-stop layer 23. Parts of upper portion 67 terminate on top surface 19 of lower low-k dielectric film 17. Two-tiered, dual-damascene opening 61 is intended to be exemplary only, and various other openings may be formed using dual-damascene techniques. For example, the dual-damascene or two-tiered opening may include upper portion 67 having a relative width greater than illustrated and more than one lower opening extending therefrom, such that a pillar or unetched portion exists between the lower openings. According to another exemplary embodiment, upper portion 67 may terminate on top surface 25 of etch-stop layer 23 which remains after the etching process exposes upper surface 3 of conductive wire 5. The dual damascene opening may subsequently be filled with a conductive material as an interconnect medium. A suitable diffusion barrier material may optionally be formed between conductive line 5 and the subsequently added interconnect medium. In an exemplary embodiment, the interconnect medium formed within the dual damascene opening may serve as a via to connect a subjacent conductive feature to a superjacent conductive feature. According to other exemplary embodiments, the interconnect medium may serve other functions.

A fundamental concept of the present invention is that any of various dual-damascene structures may be formed. More particularly, after an opening such as opening 43 shown in FIG. 4, is formed to extend through a low-k dielectric film, or a plurality of low-k dielectric films such as the two such films shown in FIG. 4, chemically amplified DUV photoresist may be introduced to the arrangement to effectuate a subsequent pattern. An advantage of the present invention is that amine or other N—H base groups are not nested within the low-k dielectric films, and therefore do not diffuse from the low-k dielectric films into the photosensitive film when such a photosensitive film is introduced to the structure, to render affected portions of the photosensitive film insoluble in developer. Pattern distortion is therefore alleviated, and insoluble, difficult-to-remove photoresists do not result.

The preceding merely illustrates the principles of the invention. It will thus be appreciated that those skilled in the art will be able to devise various arrangements which, although not explicitly described or shown herein, embody the principles of the invention and are included within its scope and spirit. Furthermore, all examples and conditional language recited herein are principally intended expressly to be only for pedagogical purposes and to aid in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and the functional equivalents thereof. Additionally, it is intended that such equivalents include both currently known equivalents and equivalents developed in the future, i.e., any elements developed that perform the same function, regardless of structure. The scope of the present invention, therefore, is not intended to be limited to the exemplary embodiments shown and described herein. Rather, the scope and spirit of the present invention is embodied by the appended claims.

What is claimed is:

1. A semiconductor product comprising a barrier layer disposed between a copper-containing structure and a low-k dielectric film, said barrier layer comprising a composite film structure including a nitrogen-containing, substantially oxygen-free first film forming a boundary with said copper-containing structure and an oxygen-containing, substantially nitrogen-free second film forming a boundary with said low-k dielectric film in which said first film comprises nitrogen-doped silicon carbide and said second film comprises oxygen-doped silicon carbide.

2. The semiconductor product as in claim 1, in which said copper-containing structure comprises a surface including a copper wire formed within an insulating material.

3. The semiconductor product as in claim 1, in which said barrier layer is formed on said copper-containing structure and said low-k dielectric film is formed on said barrier layer.

4. The semiconductor product as in claim 3, further comprising an oxygen doped silicon carbide film formed over said low-k dielectric film, a further low k dielectric film formed over said oxygen-doped silicon carbide film and an oxygen-doped silicon carbide hardmask formed over said further low-k dielectric film.

5. The semiconductor product as in claim 4, in which said semiconductor product includes a two-tiered opening extending down from a top surface of said oxygen-doped silicon carbide hardmask, said two-tiered opening including a wider upper portion extending through said oxygen-doped silicon carbide hardmask, said further low-k dielectric film, and said oxygen doped silicon carbide film, and a lower, narrower portion extending through said low-k dielectric film, said second film, and said first film.

6. The semiconductor product as in claim 1, wherein said low-k dielectric film is formed of SiOC—H.

7. The semiconductor product as in claim 1, wherein said low-k dielectric film has a dielectric constant less than 3.5.

8. A semiconductor product comprising a barrier layer disposed between a readily-oxidizable conductive material and a low-k dielectric film, said barrier layer comprising a composite film structure including a nitrogen-containing, substantially oxygen-free first film forming a boundary with said conductive material and an oxygen-containing, substantially nitrogen-free second film forming a boundary with said low-k dielectric film, each of said first film and said second film formed of silicon carbide.

9. A semiconductor product comprising a film stack including:
   a lower low-k dielectric film;
   an etch-stop layer formed over said low-k dielectric film;
   an upper low-k dielectric film formed over said etch-stop layer; and
   a hardmask layer formed over said upper low-k dielectric film, each of said etch-stop layer and said hardmask layer formed of oxygen-doped silicon carbide.

10. The semiconductor product as in claim 9, in which said film stack includes a two-tiered opening formed therein, said two-tiered opening including a wider upper portion disposed over a narrower lower portion,
   said narrower lower portion extending through said lower low-k dielectric film,
   said wider upper portion extending through said etch-stop layer, said upper low-k dielectric film and said hardmask layer, and
   said two-tiered opening filled with a conductive material.

11. The semiconductor product as in claim 10, further comprising a composite film structure formed beneath said lower low-k dielectric film and including a nitrogen-doped silicon carbide film formed beneath an oxygen-doped silicon carbide film, and wherein said narrower lower portion further extends through said composite film structure and said two-tiered opening extends to a bottom surface formed of a further conductive material.

12. The semiconductor product as in claim 11, wherein said further conductive material comprises copper.

13. A semiconductor product comprising a film stack including:
   a copper-containing surface;
   a nitrogen-containing first barrier layer disposed over said copper-containing surface;
   an oxygen-doped, substantially nitrogen-free second barrier layer disposed over said first barrier layer;
   a first low-k dielectric film disposed on said second barrier layer;
   an oxygen-doped silicon carbide etch-stop layer disposed over said first low-k dielectric film;
   a second low-k dielectric film disposed over said etch-stop layer; and
   an oxygen-doped silicon carbide hardmask film disposed over said second low-k dielectric film.

* * * * *